(12) United States Patent
Chu et al.

(10) Patent No.: US 11,862,754 B2
(45) Date of Patent: *Jan. 2, 2024

(54) METHOD FOR FABRICATING (LED) DICE USING SEMICONDUCTOR STRUCTURES ON A SUBSTRATE AND LASER LIFT-OFF TO A RECEIVING PLATE

(71) Applicants: SemiLEDs Corporation, Chu-Nan (TW); SHIN-ETSU CHEMICAL CO., LTD., Tokyo (JP)

(72) Inventors: Chen-Fu Chu, Hsinchu (TW); Shih-Kai Chan, Miaoli County (TW); Yi-Feng Shih, Miaoli County (TW); David Trung Doan, Hsinchu County (TW); Trung Tri Doan, Hsinchu County (TW); Yoshinori Ogawa, Kanagawa (JP); Kohei Otake, Gunma (JP); Kazunori Kondo, Gunma (JP); Keiji Ohori, Saitama (JP); Taichi Kitagawa, Gunma (JP); Nobuaki Matsumoto, Gunma (JP); Toshiyuki Ozai, Gunma (JP); Shuhei Ueda, Nigata (JP)

(73) Assignees: SemiLEDs Corporation, Chu-Nan (TW); Shin-Etsu Chemical Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/740,729

(22) Filed: May 10, 2022

(65) Prior Publication Data

US 2022/0271198 A1 Aug. 25, 2022

Related U.S. Application Data

(63) Continuation of application No. 16/987,478, filed on Aug. 7, 2020, now Pat. No. 11,417,799.

(Continued)

(51) Int. Cl.
*H01L 33/20* (2010.01)
*H01L 33/00* (2010.01)
*H01L 33/44* (2010.01)

(52) U.S. Cl.
CPC .......... *H01L 33/20* (2013.01); *H01L 33/0093* (2020.05); *H01L 33/0095* (2013.01); *H01L 33/44* (2013.01); *H01L 2933/0025* (2013.01)

(58) Field of Classification Search
None
See application file for complete search history.

(56) References Cited

U.S. PATENT DOCUMENTS 6,071,795 A 6/2000 Cheung et al.
6,420,242 B1 7/2002 Cheung et al.
(Continued)

FOREIGN PATENT DOCUMENTS

EP 0 616 376 B1 11/1997
JP 2002366054 A 12/2002
(Continued)

OTHER PUBLICATIONS

M. K. Kelly et al., Optical patterning of GaN films, Applied Physics Letters 69, Sep. 16, 1996, p. 1749-1751.
(Continued)

*Primary Examiner* — Bradley Smith
(74) *Attorney, Agent, or Firm* — Stephen A. Gratton

(57) ABSTRACT

A method for fabricating light emitting diode (LED) dice includes the steps of: providing a substrate, and forming a plurality of die sized semiconductor structures on the substrate. The method also includes the steps of providing a receiving plate having an elastomeric polymer layer, placing the substrate and the receiving plate in physical contact with an adhesive force applied by the elastomeric polymer layer, and performing a laser lift-off (LLO) process by directing a
(Continued)

uniform laser beam through the substrate to the semiconductor layer at an interface with the substrate to lift off the semiconductor structures onto the elastomeric polymer layer. During the laser lift-off (LLO) process the elastomeric polymer layer functions as a shock absorber to reduce momentum transfer, and as an adhesive surface to hold the semiconductor structures in place on the receiving plate.

4 Claims, 16 Drawing Sheets

Related U.S. Application Data

(60) Provisional application No. 62/892,644, filed on Aug. 28, 2019.

(56) References Cited

U.S. PATENT DOCUMENTS

| | | | |
|---|---|---|---|
| 6,815,312 | B2 | 11/2004 | Furukawa et al. |
| 6,818,532 | B2 | 11/2004 | Yeom et al. |
| 6,959,854 | B2 | 11/2005 | Yokokawa et al. |
| 7,473,571 | B2 | 1/2009 | Hwang et al. |
| 7,670,929 | B2 | 3/2010 | Bourdelle et al. |
| 7,736,945 | B2 | 6/2010 | Schiaffino et al. |
| 7,842,547 | B2 | 11/2010 | Shelton et al. |
| 8,294,172 | B2 | 10/2012 | Yoo et al. |
| 8,552,436 | B2 | 10/2013 | Bibl et al. |
| 8,794,501 | B2 | 8/2014 | Bibl et al. |
| 8,921,204 | B2 | 12/2014 | Chu et al. |
| 11,417,799 | B2 | 8/2022 | Chu et al. |
| 2005/0023550 | A1 | 2/2005 | Eliashevich et al. |
| 2005/0227455 | A1 | 10/2005 | Park et al. |
| 2013/0313562 | A1* | 11/2013 | Epler .................. H01L 33/0093 438/22 |
| 2015/0364639 | A1 | 12/2015 | Hong et al. |
| 2019/0165231 | A1* | 5/2019 | Doan ...................... H01L 33/62 |
| 2021/0066541 | A1 | 3/2021 | Chu et al. |
| 2021/0066547 | A1 | 3/2021 | Doan et al. |
| 2021/0111326 | A1* | 4/2021 | Shiau .................. H01L 33/642 |
| 2022/0359785 | A1 | 11/2022 | Chu et al. |
| 2023/0018855 | A1 | 1/2023 | Chu et al. |

FOREIGN PATENT DOCUMENTS

| | | |
|---|---|---|
| JP | 2003332633 A | 11/2003 |
| JP | 2006128710 A | 5/2006 |
| JP | 2010161221 A | 7/2010 |
| JP | 2010177390 A | 8/2010 |
| JP | 2017168548 A | 9/2017 |
| JP | 2017533453 A | 11/2017 |
| JP | 2018060993 A | 4/2018 |
| JP | 2018531504 A | 10/2018 |
| JP | 2019067892 A | 4/2019 |
| KR | 10-2019-0057054 | 5/2019 |
| WO | WO 2010/015878 A2 | 2/2010 |

OTHER PUBLICATIONS

W. S. Wong et al., Damage-free separation of GaN thin films from sapphire substrates, Applied Physics Letters 72, Feb. 2, 1998, p. 599-601.

W. S. Wong et al, Fabrication of thin-film InGaN light-emitting diode membranes by laser lift-off, Applied Physics Letters, Sep. 6, 1999, p. 1360-1362.

U.S. Appl. No. 10/118,316, filed Apr. 9, 2002, Jong L. Lee et al., entitled "Method of Fabrication Vertical Structure LEDS", pp. 1-25, abandoned.

Corresponding Japanese patent specification claiming priority to application No. 2020-016200 filed on Feb. 23, 2020 entitled "Addition Curable Silicone Pressure-Sensitive Adhesive Composition and Cured Product Thereof", pp. 1-26.

International application No. PCT/US 20/47137, International Search Report and Written Opinion of the International Searching Authority, dated Nov. 19, 2020, pp. 1-10.

U.S. Appl. No. 16/987,478, filed Aug. 7, 2020, "Method for Fabricating (LED) Die Using Laser Lift-Off From a Substrate to a Receiving Plate", Chen-Fu Chu et al., Non-Final Rejection, dated Dec. 16, 2021, pp. 1-7.

U.S. Appl. No. 16/987,478, filed Aug. 7, 2020, "Method for Fabricating (LED) Die Using Laser Lift-Off From a Substrate to a Receiving Plate", Chen-Fu Chu et al., Notice of Allowance, dated Mar. 30, 2022, pp. 1-11.

U.S. Appl. No. 16/987,478, filed Aug. 7, 2020, "Method for Fabricating (LED) Die Using Laser Lift-Off From a Substrate to a Receiving Plate", Chen-Fu Chu et al., Notice of Allowance, dated May 5, 2022, pp. 1-8.

* cited by examiner

METHOD FOR FABRICATING (LED) DICE USING SEMICONDUCTOR STRUCTURES ON A SUBSTRATE AND LASER LIFT-OFF TO A RECEIVING PLATE

CROSS REFERENCE TO RELATED APPLICATION

This application is a continuation of Ser. No. 16/987,478, filed Aug. 7, 2020, U.S. Pat. No. 11,417,799, which claims priority from U.S. Provisional No. 62/892,644, filed Aug. 28, 2019, which is incorporated herein by reference.

FIELD

This disclosure relates to semiconductor fabrication and particularly to the fabrication of light emitting diode (LED) dice using semiconductor fabrication techniques.

BACKGROUND

In the fabrication of light emitting diode (LED) dice, GaN epitaxial stacks can be fabricated using a substrate, such as sapphire. For example, vertical light emitting diode (VLED) dice can be fabricated on a sapphire substrate along with a continuous secondary substrate formed using eutectic metal to bond a secondary substrate or by deposition of a secondary substrate on the epitaxial stacks using electroplating techniques.

FIGS. 1A-1C illustrate a prior art method of fabricating light emitting diode (LED) dice 10 (FIG. 1C) on a substrate 12. FIG. 1A illustrates the forming of semiconductor structures 14 comprised of a p-GaN layer 16, multiple quantum well (MQW) layers 18 and an n-GaN layer 20. FIG. 1B illustrates etching of openings 22 to define the (LED) dice 10. FIG. 1C illustrates forming of an insulating layer 26 in the openings 22, and forming of a continuous connecting secondary substrate 24 on the (LED) dice 10. FIG. 1C also illustrates the fabrication process following laser lift-off (LLO) of the substrate 12 and illustrates roughened surfaces 28 of the (LED) dice 10.

One problem that occurs during the laser lift-off (LLO) process involves the thermal decomposition of the n-GaN layer 20 (FIG. 1C) at the interface with the substrate 12 (e.g., GaN/sapphire interface). This thermal decomposition can produce explosive forces, forming cracks and micro-cracks in the (LED) dice 10. These cracks and micro-cracks can also spread out in unpredictable directions producing unusable (LED) dice 10. In addition, the damage caused by the momentum transfer during laser lift-off (LLO) causes device leakage and reliability issues. In the prior art, the continuous secondary substrate 24 (FIG. 1C) can be bonded, deposited, or grown on the semiconductor structures 14 before the laser lift-off (LLO) process to hold the (LED) dice 10 in place. However, after the secondary substrate 24 has been removed, due to the secondary substrate 24 holding the (LED) dice 10 together, the explosive force may have also caused damage to the epitaxial layers. The additional step of dicing is also needed to separate each single (LED) die 10 from adjacent dice before the single (LED) die 10 can be picked. The dicing process using a dicing saw or laser cutting is costly due to equipment cost and yield loss.

The present disclosure is directed to a method of laser lift-off (LLO) of semiconductor structures from a substrate without the need to bonding or forming a secondary substrate and without damage to the semiconductor structures. The method also arranges the semiconductor structures on a receiving plate ready for picking up without the need to perform dicing.

SUMMARY

A method for fabricating light emitting diode (LED) dice includes the initial steps of providing a substrate and forming a plurality of die sized semiconductor structures on the substrate. The configuration of the semiconductor structures will depend on the type of (LED) dice being fabricated. For example, the method can be used for fabricating vertical light emitting dice (VLED) or flip chip light emitting dice (FCLED).

The method also includes the steps of providing a receiving plate having an elastomeric polymer layer with adhesive characteristics, and placing the substrate and the receiving plate in physical contact with an adhesive force applied by the elastomeric polymer layer. In illustrative embodiments, the elastomeric polymer layer comprises a curable pressure sensitive curable adhesive.

The method also includes the step of performing a laser lift-off (LLO) process by directing a uniform laser beam through the substrate to the semiconductor layer at the interface with the substrate to lift off the semiconductor structures onto the elastomeric polymer layer. During the laser lift-off (LLO) process, the laser beam is focused on the semiconductor structures one at a time in sequence to remove either all of the semiconductor structures, or just selected semiconductor structure on the substrate. In addition, the laser beam has an outline greater than the footprint of a single semiconductor structure to form laser lift-off (LLO) areas that are greater than the areas of the semiconductor structures. In addition, during the lift-off (LLO) process, the elastomeric polymer layer on the receiving plate functions as a shock absorber to absorb kinetic energy from the semiconductor structures via momentum energy transfer.

The method can also include the step of selecting a laser wavelength and power such that during the laser lift-off (LLO) process, the laser beam can transmit through the substrate and be absorbed by the semiconductor layer at the interface with the substrate. In addition, by selecting the laser wavelength and power, the laser beam carries an energy density well below an absorption threshold of the substrate, allowing it to transmit through the substrate. In contrast, the laser energy density is high enough to cause photo-inducted decomposition of the semiconductor layer at the interface with the substrate, which allows debonding of the semiconductor layer at the interface. However, the receiving plate prevents any damage to the semiconductor structures by momentum transfer, and the elastomeric polymer material holds the die sized semiconductor structures in place on the receiving plate. The method can fabricate (LED) dice having a desired thickness that are as thin as the thickness of the epitaxial layers and the metal layers as there is no secondary substrate needed. The resulting thickness can be less than 50 µm and as thin as 10 µm. The method is particularly good for mini or micro LED dice having a width and length of less than 200 µm.

Following the laser lift-off (LLO) step, the method can also include the step of removing the die sized semiconductor structures from the receiving plate. This step can be performed using a conventional technique such as a pick and place mechanism for semiconductor dice, or a stamp having a higher adhesive force than the elastomeric polymer layer that is holding the semiconductor dice in place on the receiving plate. Since the die sized semiconductor structures are separated from the adjacent semiconductor structures before LLO and the secondary substrate is not needed, the step of separating each single semiconductor structure from adjacent structures using a die saw of laser dicing is eliminated, resulting in lower cost and higher yield.

DETAILED DESCRIPTION

Referring to FIGS. 2A-2E, a first step in a method for fabricating light emitting diode (LED) dice includes the steps of providing a substrate 30 (FIG. 2A) and forming a plurality of die sized semiconductor structures 32 (FIG. 2E) on the substrate 30. In an illustrative embodiment, the substrate 30 comprises a sapphire wafer and the semiconductor structures 32 have a die size and include different layers of compound semiconductor materials formed on the substrate 30.

The die sized semiconductor structures 32 can be formed using conventional semiconductor fabrication techniques and physically separated by etching a pattern of criss cross openings 38 (FIG. 2B) to the surface of the substrate 30. However, the exact construction of the semiconductor structures 32 will depend on the type of (LED) dice being fabricated.

Figure 2A:
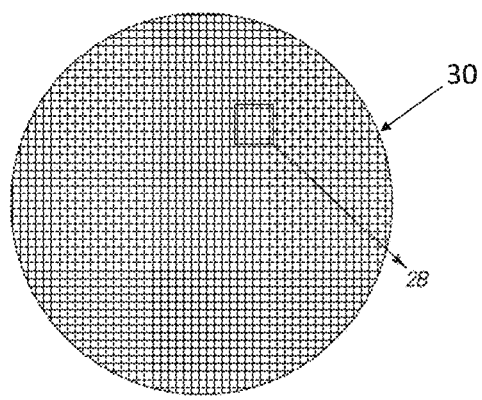
FIG. 2A is a schematic plan view of a substrate and semiconductor structures formed on the substrate.
Figure 2B:
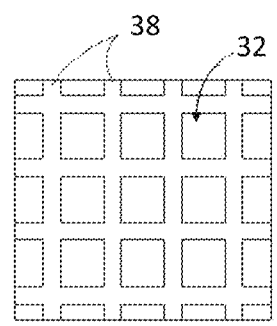
FIG. 2B is an enlarged portion of the substrate taken along section line 2B of FIG. 2A.
Figure 2C:
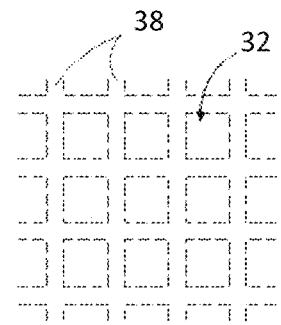
FIG. 2C is a bottom view equivalent to FIG. 2B but taken from the opposing side of the substrate.
Figure 2D:
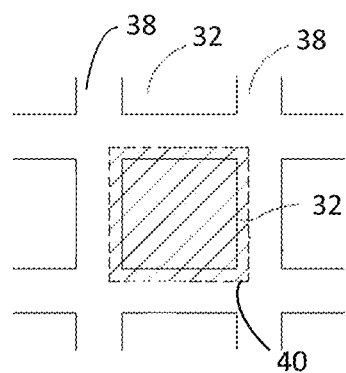
FIG. 2D is a schematic plan view illustrating a laser beam focused on one of the semiconductor structures during a laser lift-off (LLO) step of the method.
Figure 2E:
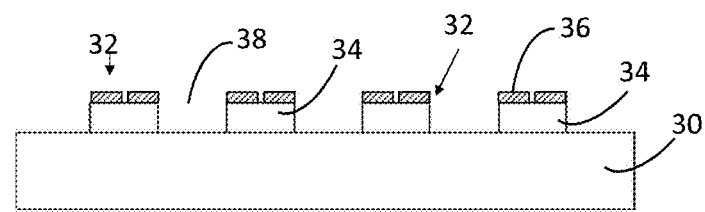
FIG. 2E is an enlarged schematic cross sectional view illustrating the semiconductor structures on the substrate.
Figure 9A:
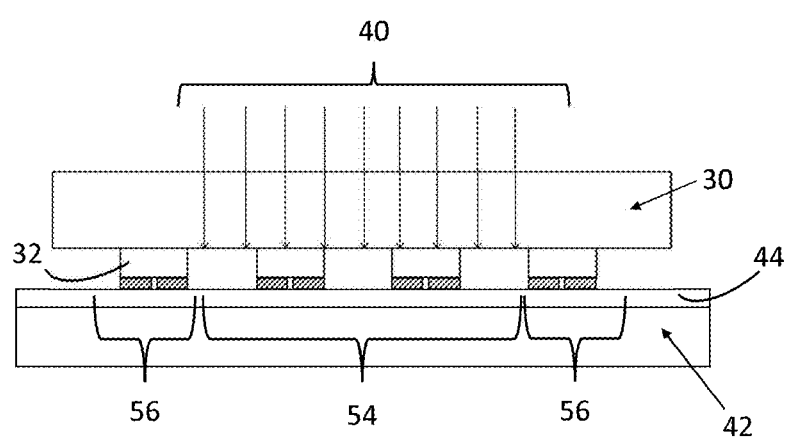
FIG. 9A is a schematic cross sectional view illustrating characteristics of the laser lift-off (LLO) step of the method wherein the semiconductor structures can be selectively lifted off of the receiving plate.
Figure 9B:
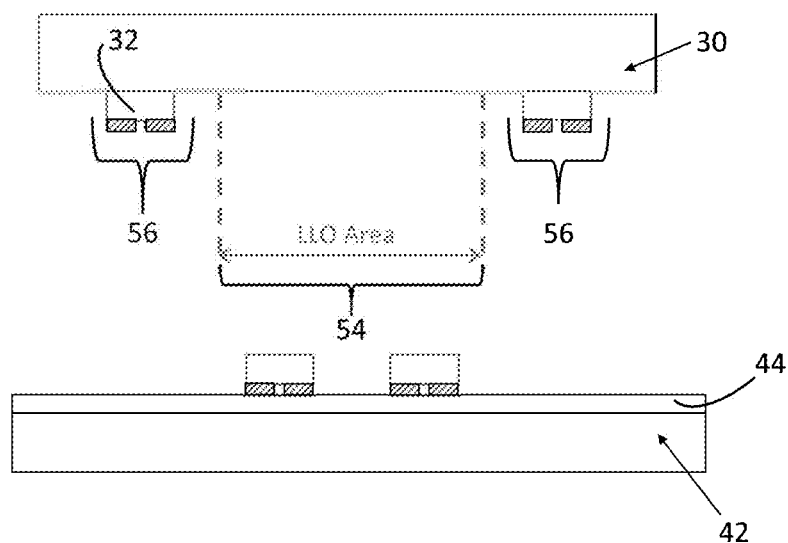
FIG. 9B is a schematic cross sectional view after the laser lift-off (LLO) step of the method wherein the substrate includes non-laser lift-off (LLO) areas where the die sized semiconductor structures are attached to the substrate and laser lift off (LLO) areas where the die sized semiconductor structures have been lifted onto an elastomeric layer of the receiving plate.

The GaN layer 34 (FIG. 2E) can be hetero-epitaxially grown on the substrate 30 (FIG. 2E) using techniques that are known in the art. Please note that following the etching process, there is no GaN material in the openings 38. To facilitate GaN crystal growth, an initial GaN layer can be deposited at a relatively low temperature, less than 800° C., causing the initial GaN layer to contain a high density of various defects due to a large lattice mismatch. Crystal defects, such as dislocations, nanopipes and inversion domains, elevate surface energy which results in higher absorption of the laser beam. During a subsequent laser-lift off (LLO) step, GaN will quickly decompose to gallium metal vapor and nitrogen gas resulting in explosive force acting on the semiconductor structures 32 and the substrate 30. The die sized semiconductor structures 32 are much smaller in weight as well as size, compared to the substrate 30, such that each semiconductor structure 32 will have a large force acting on it. In the illustrative embodiment, the semiconductor structures 32 are measured in microns and the substrate 30 is measured in millimeters. As also shown in FIG. 2E, a laser beam 40 used for the subsequent laser lift-off (LLO) step has an outline that is larger than the footprint of the die sized semiconductor structures 32 that one desires to lift off (LLO). In addition, one can lift off more than one die sized semiconductor structure at a time by changing the size of the laser beam 40 as shown in FIGS. 9A-9B.

Figure 3:
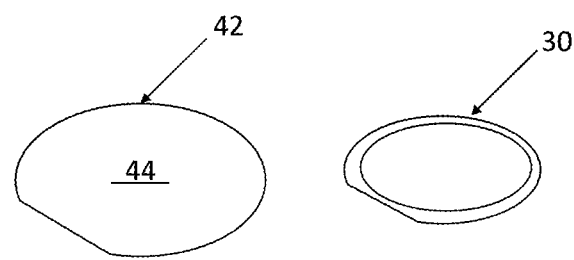
FIG. 3 is a schematic perspective view illustrating a receiving plate and the substrate prior to being placed in physical contact.

Referring to FIG. 3, the method for fabricating light emitting diode (LED) dice also includes the step of providing a receiving plate 42 coated with an elastomeric polymer layer 44. A preferred material for the receiving plate comprises quartz. Exemplary materials for the elastomeric polymer layer 44 include silicone, siloxane, rubber, or other elastomeric based material. As shown in FIG. 3, the receiving plate 42 can have a size and shape that corresponds to, but is slightly larger than, the size and shape of the substrate 30. For example, if the substrate 30 comprises a circular wafer, the receiving plate 42 can comprise a circular plate that is slightly larger than the circular wafer.

Figure 4:
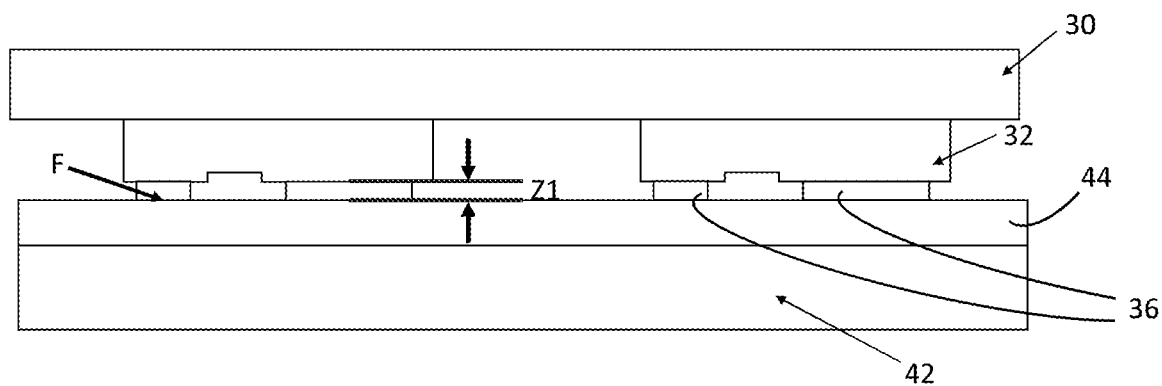
FIG. 4 is an enlarged schematic cross sectional view illustrating the substrate and the receiving plate in physical contact with an adhesive force applied by the elastomeric polymer layer.

Referring to FIG. 4, the method for fabricating light emitting diode (LED) dice also includes the step of placing the substrate 30 and the receiving plate 42 in physical contact with an adhesive force applied by the elastomeric polymer layer 44. As shown in FIG. 4, the semiconductor structures 32 can have the configuration of vertical light emitting diode (VLED) dice, such that the pad electrodes 36 provide a spacing of Z1 between the semiconductor structures 32 and the elastomeric polymer layer 44. In addition, an adhesive force F is applied to the pad electrodes 36 by the elastomeric polymer layer 44. The die sized semiconductor structure 32 is still physically connected to the substrate 30 but physically separated from the adjacent semiconductor structures.

Figure 5:
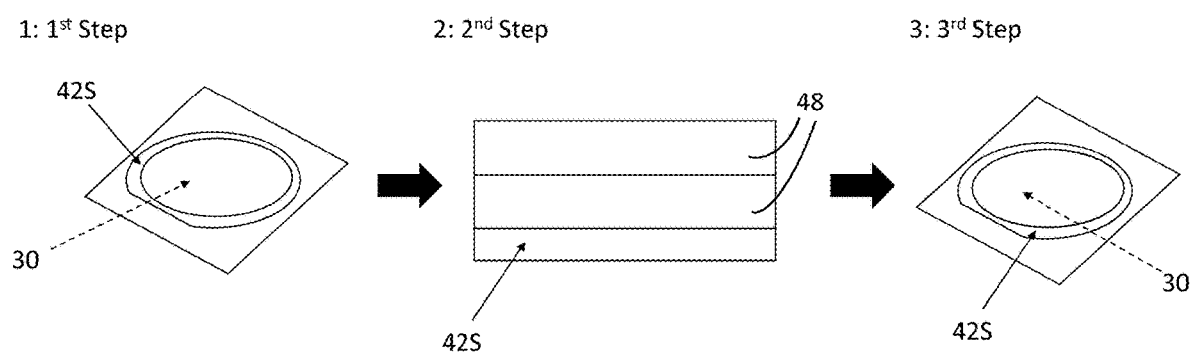
FIG. 5 is a schematic flow diagram illustrating an exemplary sequence for placing the substrate and the receiving plate in physical contact.
Figure 6:
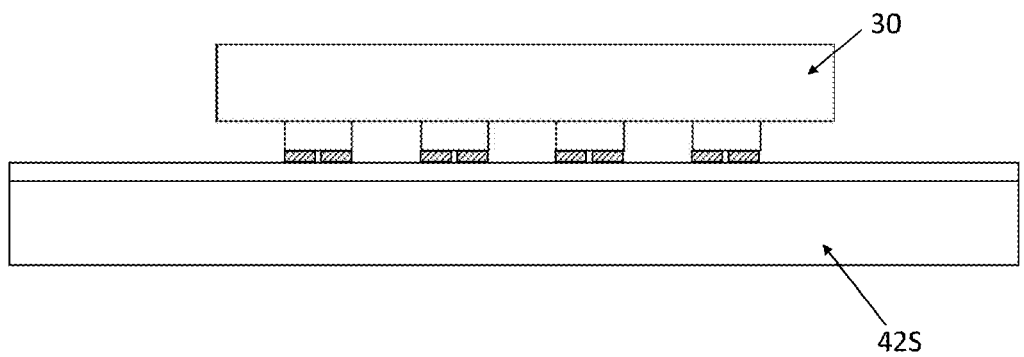
FIG. 6 is a schematic cross sectional view illustrating the substrate and the receiving plate in physical contact.

Example 1. Referring to FIGS. 5 and 6, an exemplary placing step uses a four inch diameter circular substrate 30 and a six inch square receiving plate 42S. In this example, the elastomeric polymer layer 44 comprises a curable silicone pressure sensitive adhesive configured to apply the adhesive force. Other suitable materials for the elastomeric polymer layer 44 include sorbothane and neoprene. One suitable adhesive is disclosed in Japanese Patent Application No. 2020-016200 filed on Feb. 3, 2020, entitled "Addition Curable Silicone Pressure-Sensitive Adhesive Composition and Cured Product Thereof", which is incorporated by reference.

As shown in FIG. 5, the placing step can include a first step of placing the substrate 30 and the receiving plate 42S in physical contact, a second step of applying a weight 48 and curing the elastomeric polymer layer 44 using the weight 48, and a third step of removing the weight 48. By way of example, the elastomeric polymer layer 44 can have an adhesive force of more than 0.08 MPa, <70 type A hardness, and a tensile strength of >0.01 MPa.

Table 1 identifies some characteristics of a spin on elastomeric polymer layer 44 made of silicone.

TABLE 1

| Materials | Silicone Sample |
| --- | --- |
| Viscosity (Pa-s) | 3.0-7 |
| Spin coating condition (Target thickness = 20 µm) | 2500 RPM × 60 - 180 sec |
| Standard curing condition | 150° C.; 30 min - 2 hr |
| Hardness (Type A) | 5-70 |
| Tensile strength (MPa) | 0.5-5 |
| Elongation at break (%) | 90-250 |
| Specific gravity (g/cm$^3$) | 1.03-1.1 |
| Sticky force at 200 mm/min (MPa) | 0.05-0.5 |

Figure 7:
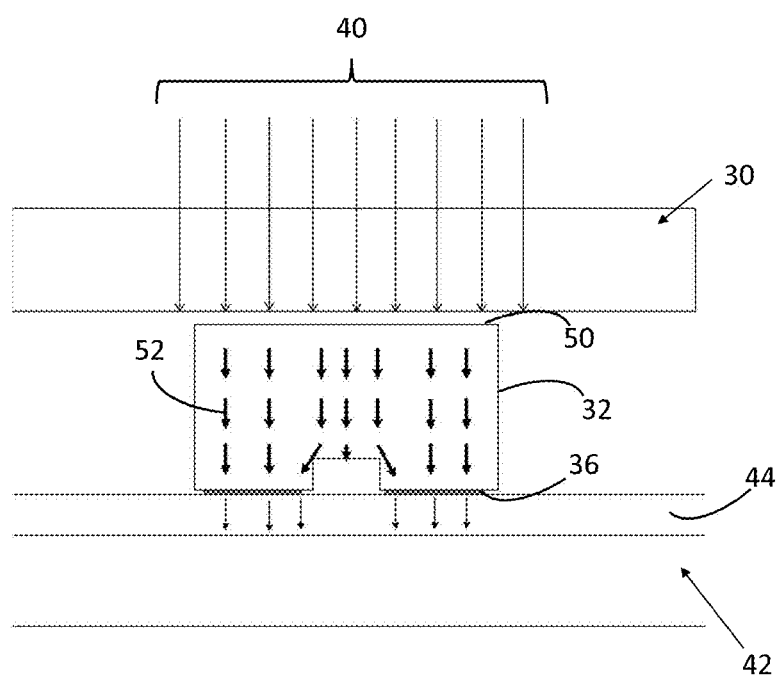
FIG. 7 is a schematic cross sectional view illustrating a laser lift-off (LLO) step of the method.
Figure 8:
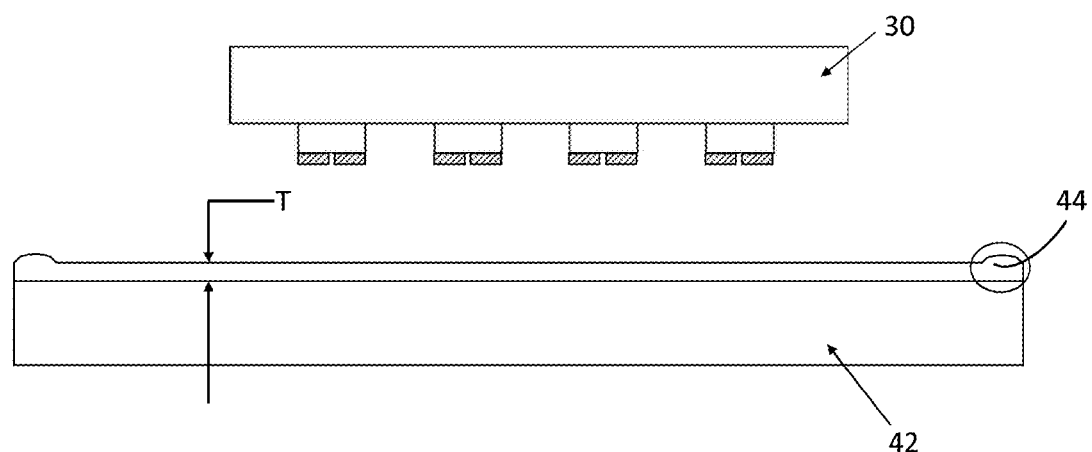
FIG. 8 is a schematic cross sectional view illustrating exemplary characteristics of the receiving plate for laser lift-off (LLO) with a spin on elastomeric polymer layer.

Referring to FIGS. 7 and 8, the method for fabricating light emitting diode (LED) dice also includes the step of performing a laser lift-off (LLO) process. During the laser lift-off process, a uniform laser beam 40 is directed through the substrate 30 onto an interfacial semiconductor layer 50 at the interface with the substrate 30 to lift off the die sized semiconductor structures 32 onto the receiving plate 42. During the laser lift-off (LLO) process each semiconductor structure 32 is individually pushed towards the receiving plate 42 by decomposition of the interfacial semiconductor layer 50. For example, with the interfacial semiconductor layer 50 comprised of GaN, decomposition will be to gallium (G) and nitrogen (N2) in gaseous form. In FIG. 7, this explosive force is represented by explosive force arrows 52 that pass through the semiconductor structure 32 and are absorbed by the elastomeric polymer layer 44 on the receiving plate 42. The elastomeric polymer layer 44 acts as a soft cushion or shock absorber to absorb the kinetic energy from the semiconductor structure 32 via momentum energy transfer. The semiconductor structure 32 comes to rest on the elastomeric polymer layer 44 undamaged and stays in the desired position on the receiving plate 42.

Example 2. An exemplary laser lift-off (LLO) process uses a 248 nm laser beam 40, such as a KrF excimer laser with wavelength of λ=248 nm and pulse width of 25 ns. The laser output energy can be varied from 10 nJ to 50 mJ. The laser beam is reshaped and homogenized using a special optical system to form an uniform beam profile, preferably less than 10% RMS. The LLO processing beam passed through a projection system and then focuses onto the wafer/sample with a spot size such as 0.9×0.9 mm$^2$. Other laser beam sizes and shapes can be used. The excimer laser is not limited to KrF (248 nm). For example, the excimer laser can be from a F2 excimer laser (155 nm), to an ArF excimer laser (198 nm). An excimer laser typically uses a combination of a noble gas (argon, krypton, or xenon) and a reactive gas (fluorine or chlorine). The receiving plate 42 is preferably larger than the substrate 30. In addition, the receiving plate 42 is preferably flat with a TTV (total thickness variation) of less than <5 µm, but more preferably less than <2 um, for preventing flipping, titling, rotating and cracking of the semiconductor structures 32 after the laser lift-off (LLO) process. In addition, the receiving plate 42 can include one or more alignment marks for aligning the semiconductor structures 32 on the substrate 30. Proper alignment also ensures proper placement of the semiconductor structure 32 on the receiving plate 42 following the laser lift-off (LLO) process (i.e., desired coordinate on the receiving plate 42). In addition, the receiving plate 42 can include one or more notches or flats for pre-alignment.

Example 3. Referring to FIGS. 9A and 9B, in this example, the receiving plate 42 includes a spin-on elastomeric polymer layer 44 comprised of a curable silicone pressure-sensitive adhesive composition. Also in this example, the substrate 30 comprises a four inch diameter wafer, and the receiving plate 42 comprises a six inch diameter circular plate. Further, the receiving plate 42 has a TTV (total thickness variation) of <5 µm. For forming the elastomeric polymer layer 44 the elastomer can be dispensed on the center of the receiving plate 42 using a spin coater to provide a selected thickness T (e.g., ~20 µm). For a spin-on process, the thickness T of the elastomeric polymer layer 44 will be the function of spin speed, the spin-on liquid viscosity and other factors. Normally the thickness T is radially dependent. To provide optimum thickness uniformity, one would use a larger diameter receiving plate 42. Rather than spin coating, the elastomeric polymer layer 44 can also be applied by vapor deposition, doctor blade, or screen printing.

Figure 1A:
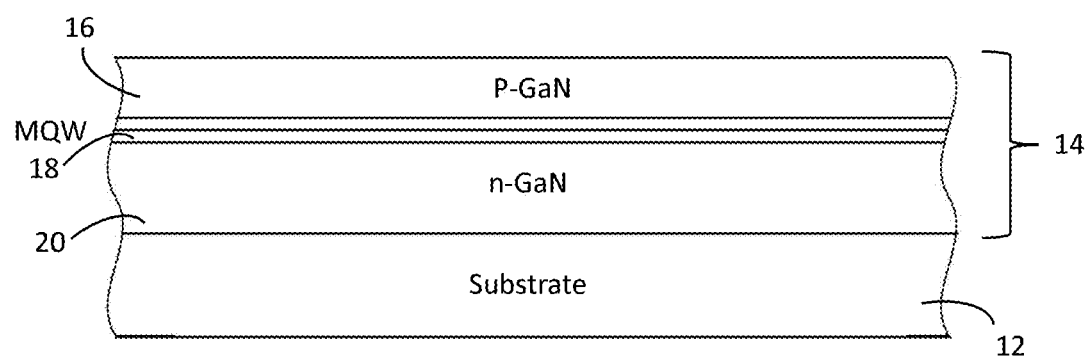
FIGS. 1A-1C are enlarged schematic cross sectional drawings illustrating a prior art lift-off (LLO) process performed using a connecting substrate.
Figure 1B:
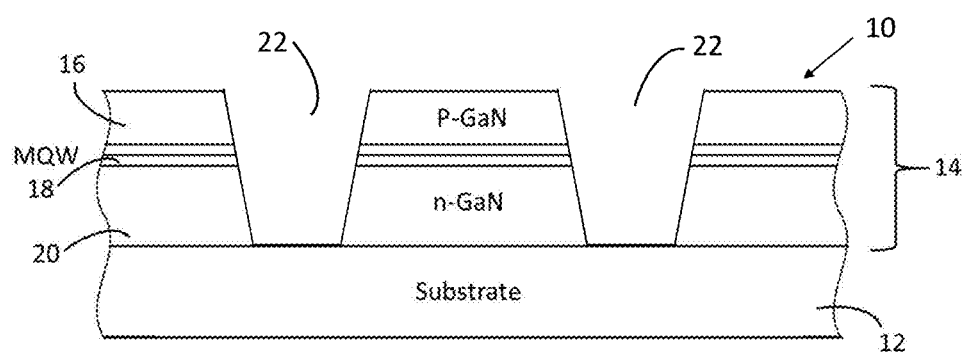
Figure 1C:
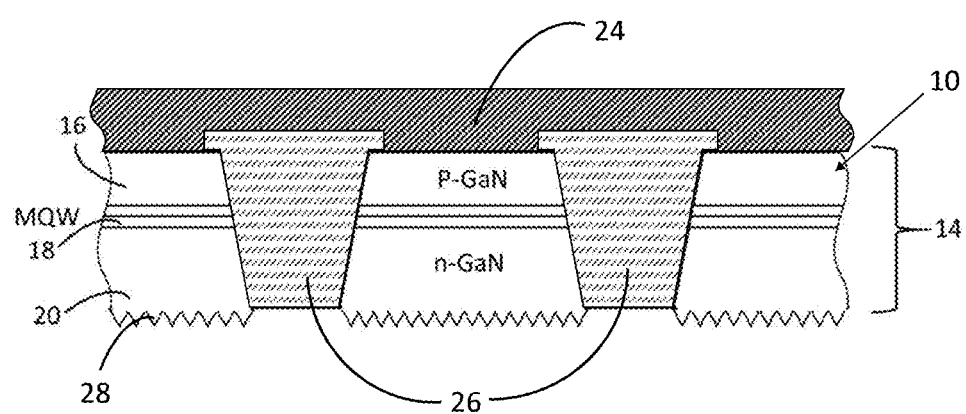

As shown in FIG. 9A, a laser lift off area 54 can be selectively located by appropriate focusing of the laser beam 40 to lift selected semiconductor structures 32 onto the receiving plate 42. Using the receiving plate 42, one could selectively remove certain semiconductor structures 32 without performing laser lift-off (LLO) on the entire substrate 30 as with the prior art secondary substrate 24 (FIG. 1C). Following the laser lift-off (LLO) step, the method can also include the step of cleaning and or etching the surface of the semiconductor structure 32 on the receiving plate 42. The semiconductor structure 32 on receiving plate 42 can be etched to create rough surface improving its performance such as light extraction, output, handling.

With the die sized semiconductor structure 32 resting on the surface of the elastomeric polymer layer 44 of the receiving plate 42, the method can also include the step of removing the semiconductor structures 32 from the receiving plate 42. This step can be performed using a conventional technique such as a pick and place mechanism for semiconductor dice.

Figure 10:
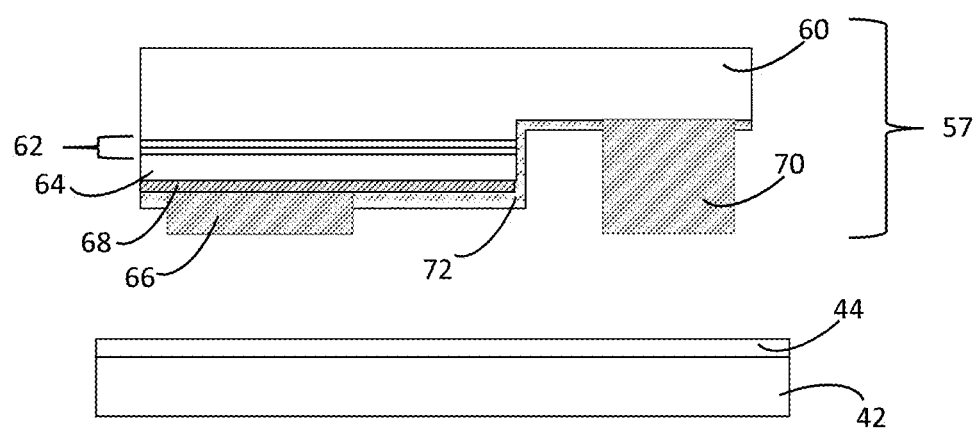
FIG. 10 is a schematic cross sectional view of a completed semiconductor structure in the form of a flip chip light emitting diode (FCLED) die.

Referring to FIG. 10, a completed semiconductor structure that has been separated from the receiving plate 42 comprises a flip chip light emitting diode (FCLED) die 32FCLED. The flip chip light emitting diode (LED) die 32FCLED includes an epitaxial stack 57 comprised of a p-type confinement layer (P-layer) 64, an n-type confinement layer (N-layer) 60, an active layer (multiple quantum well (MQW) layer) 62 between the confinement layers configured to emit light, P-metal layers 66 making contact to the p-type confinement layer (P-layer) 64, a mirror layer 68, an isolation layer 72, and an N-electrode 70 making contact to the n-type confinement layer (N-layer) 60.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating light emitting diode (LED) dice comprising:
   providing a plurality of die sized semiconductor structures on a substrate, the semiconductor structures comprised of electrodes and epitaxial stacks of compound semiconductor materials;
   providing a receiving plate having a spin coated curable silicone elastomeric polymer layer thereon;
   applying an adhesive force to the electrodes by placing the electrodes in contact with the elastomeric polymer layer with the semiconductor structures still physically connected to the substrate;
   performing a laser lift-off (LLO) process by directing a uniform laser beam through the substrate to the semiconductor layer at an interface with the substrate to lift off the semiconductor structures onto the elastomeric polymer layer, with the elastomeric polymer layer functioning as a shock absorber and an adhesive surface for holding the semiconductor structures; and
   selecting a laser wavelength and power such that during the laser lift-off (LLO) process the laser beam can transmit through the substrate and be absorbed by the semiconductor layer at the interface with the substrate.

2. The method of claim 1 further comprising removing the semiconductor structures from the receiving plate.

3. The method of claim 1 further comprising selecting a laser wavelength and power such that the laser beam can transmit through the substrate and be absorbed by the semiconductor layer at the interface with the substrate.

4. The method of claim 1 wherein during the laser lift-off (LLO) process, the laser beam is focused on the semiconductor structures at least one at a time in sequence to remove either all of the semiconductor structures, or just selected semiconductor structure on the substrate.

* * * * *